(12) United States Patent
Nagai

(10) Patent No.: US 9,922,982 B1
(45) Date of Patent: Mar. 20, 2018

(54) ELECTRIC FUSE STRUCTURE

(71) Applicants: UNITED MICROELECTRONICS CORP., Hsin-Chu (TW); Fujian Jinhua Integrated Circuit Co., Ltd., Quanzhou, Fujian province (CN)

(72) Inventor: Yukihiro Nagai, Saijo (JP)

(73) Assignees: UNITED MICROELECTRONICS CORP., Hsin-Chu (TW); Fujian Jinhua Integrated Circuit Co., Ltd., Quanzhou, Fujian Province (CN)

( * ) Notice: Subject to any disclaimer, the term of this patent is extended or adjusted under 35 U.S.C. 154(b) by 0 days.

(21) Appl. No.: 15/365,878

(22) Filed: Nov. 30, 2016

(30) Foreign Application Priority Data

Sep. 21, 2016 (CN) .......................... 2016 1 0835557

(51) Int. Cl.
| | | |
|---|---|---|
| H01L 29/00 | (2006.01) | |
| H01L 29/66 | (2006.01) | |
| H01L 27/108 | (2006.01) | |
| H01L 49/02 | (2006.01) | |
| H01L 23/525 | (2006.01) | |

(52) U.S. Cl.
CPC .... *H01L 27/10897* (2013.01); *H01L 23/5256* (2013.01); *H01L 28/90* (2013.01)

(58) Field of Classification Search
CPC ... H01L 27/10897; H01L 31/00; H01L 27/12; H01L 28/90; H01L 23/538; H01L 23/522; H01L 23/5256; H01L 29/00; H01L 29/92; H01L 29/66; H01L 29/66181; H01L 29/66825
USPC .......................................................... 257/529
See application file for complete search history.

(56) References Cited

U.S. PATENT DOCUMENTS

| | | | |
|---|---|---|---|
| 5,303,199 A | 4/1994 | Ishihara et al. | |
| 5,872,740 A | 2/1999 | Loughmiller et al. | |
| 5,998,258 A * | 12/1999 | Melnick ............ | H01L 27/10852 257/E21.009 |
| 6,699,725 B2 * | 3/2004 | Lee .......................... | H01L 28/55 257/E21.009 |
| 6,812,542 B2 | 11/2004 | Kohyama | |
| 7,423,608 B2 * | 9/2008 | Dunn ..................... | H05K 1/162 343/700 MS |
| 2011/0049670 A1 * | 3/2011 | Song ................... | H01L 23/5256 257/529 |
| 2016/0233213 A1 * | 8/2016 | Liu ..................... | H01L 23/5223 |

\* cited by examiner

*Primary Examiner* — Chuong A Luu
(74) *Attorney, Agent, or Firm* — Winston Hsu

(57) ABSTRACT

An electric fuse structure is disclosed. The electric fuse preferably includes a substrate and a stacked capacitor on the substrate. Preferably, the stacked capacitor further includes: two or more bottom electrodes on the substrate; a capacitor dielectric layer on the two or more bottom electrodes; and a top electrode on the capacitor dielectric layer.

18 Claims, 5 Drawing Sheets

ELECTRIC FUSE STRUCTURE

BACKGROUND OF THE INVENTION

1. Field of the Invention

The invention relates to an electric fuse structure, and more particularly, to an electric fuse structure implemented by stacked capacitors within a memory device.

2. Description of the Prior Art

As semiconductor processes become smaller and more complex, semiconductor components are influenced by impurities more easily. If a single metal link, a diode, or a MOS is broken down, the whole chip will be unusable. To treat this problem, fuses can be selectively blown for increasing the yield of IC manufacturing.

In general, fused circuits are redundant circuits of an IC. When defects are found in the circuit, fuses can be selectively blown for repairing or replacing defective circuits. In addition, fuses provide the function of programming circuits for various customized functions. Fuses are classified into two categories based on their operation: one type being fuses that can be cut by lasers and be linked by laser repair, whereas the other type utilizes electro-migration for both forming open circuits and for repairing. The electrical fuse for semiconductor devices may be classified into categories of poly electrical fuse, capacitor anti-fuse, diffusion fuse, contact electrical fuse, contact anti-fuse, and the like.

SUMMARY OF THE INVENTION

According to a preferred embodiment of the present invention, an electric fuse structure is disclosed. The electric fuse preferably includes a substrate and a stacked capacitor on the substrate. Preferably, the stacked capacitor further includes: two or more bottom electrodes on the substrate; a capacitor dielectric layer on the two or more bottom electrodes; and a top electrode on the capacitor dielectric layer.

According to another aspect of the present invention, a semiconductor device is disclosed. The semiconductor device includes: a substrate having a dynamic random access memory (DRAM) region and an electric fuse region defined thereon, a first stacked capacitor on the DRAM region, and a second stacked capacitor on the electric fuse region. The first stacked capacitor includes: a first bottom electrode; a first capacitor dielectric layer on the first bottom electrode; and a first top electrode on the first capacitor dielectric layer. The second stacked capacitor includes: two or more second bottom electrodes; a second capacitor dielectric layer on the two or more second bottom electrodes; and a second top electrode on the second capacitor dielectric layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
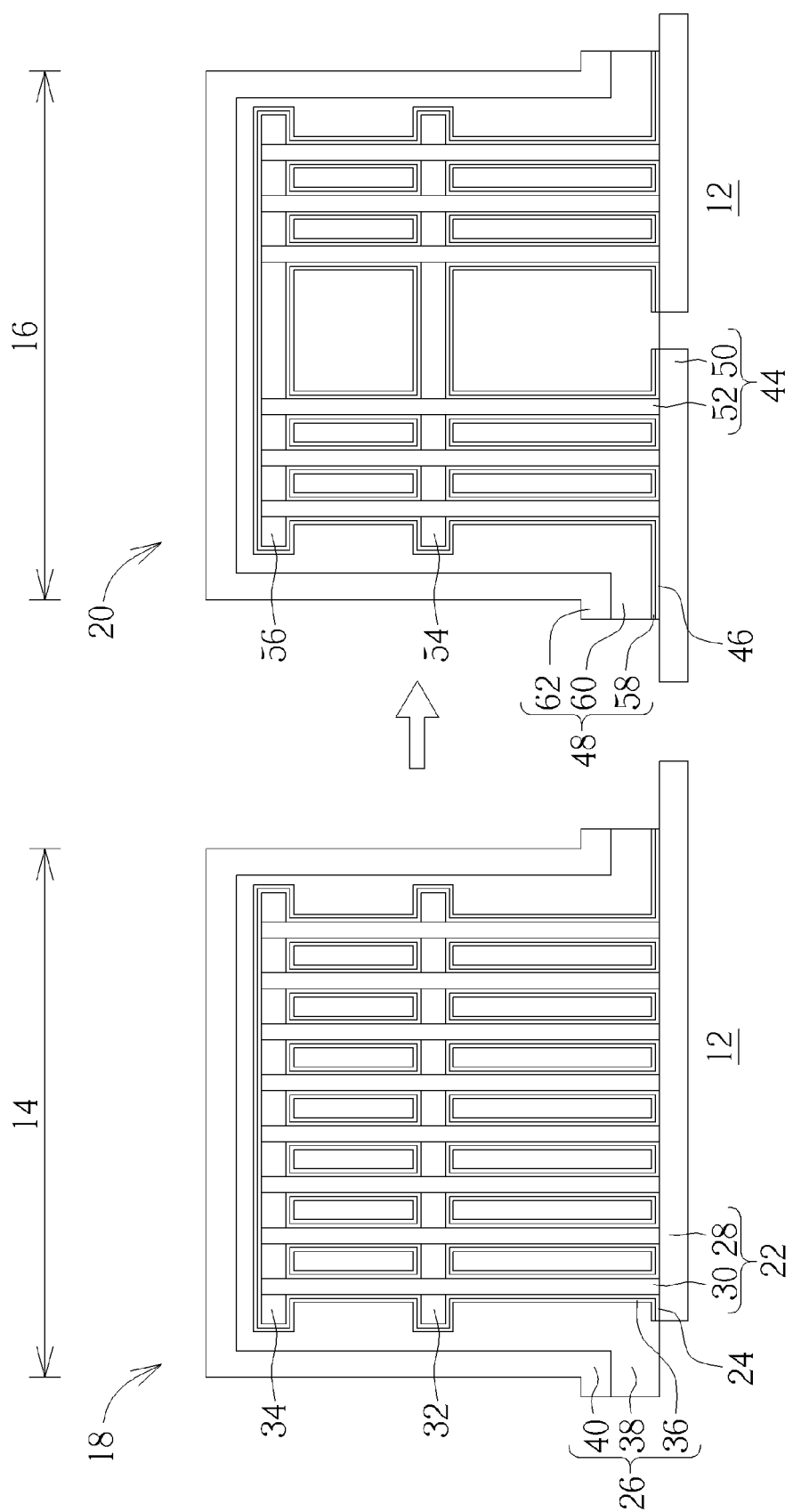
FIG. 1 illustrates a structural view of a semiconductor device according to a preferred embodiment of the present invention.

Referring to FIG. 1, FIG. 1 illustrates a structural view of a semiconductor device according to a preferred embodiment of the present invention. As shown in FIG. 1, the semiconductor device preferably being a memory device, which preferably includes a substrate 12, such as a silicon substrate, an epitaxial substrate, a silicon carbide (SiC) substrate, or a silicon-on-insulator (SOI) substrate, but not limited thereto. At least a memory region 14 and an electric fuse region 16 are defined on the substrate 12, in which the memory region 14 is preferably used for fabricating memory devices such as dynamic random access memories (DRAM), and the electric fuse region 16 is used for fabricating electric fuse structures. More specifically, the electric fuse region 16 of this embodiment primarily serves as a redundancy or spare region, so that when the defects occur on the chip or when some regions become non-functional, it would be desirable to reroute the circuits by replacing the non-functional regions with redundancy or spare region. By doing so, the device could operate once more and the functional device could further be used as an one time programmable read-only memory (OTP-ROM) device for storing program codes, allocated data, and encrypted keys.

According to a preferred embodiment of the present invention, at least a stacked capacitor is disposed on each of the memory region 14 and electric fuse region 16. For instance, a first stacked capacitor 18 is disposed on the memory region 14 and a second stacked capacitor 20 is disposed on the electric fuse region 16.

The first stacked capacitor 18 preferably includes a first bottom electrode 22 on the substrate 12 or on at least a dielectric layer (not shown) above the substrate 12, a first capacitor dielectric layer 24 on the first bottom electrode 22, and a first top electrode 26 on the first capacitor dielectric layer 24.

Viewing from a more detailed perspective, the first bottom electrode 22 further includes a first bottom electrode plate 28 and a plurality of first storage nodes 30 disposed on the first bottom electrode plate 28, in which the first storage nodes 30 are columnar shaped and vertically elongated from the first bottom electrode plate 28, the distance between the first storage nodes 30 could be equivalent or different depending on the demand of the product, and an included angle between the elongated direction of the first storage nodes 30 and the extending direction of the first bottom electrode plate 28 is preferably 90 degrees. It should also be noted that even though eight first storage nodes 30 are disclosed in this embodiment, the quantity of the first storage nodes 30 could also be adjusted according to the demand of the product.

In this embodiment, both the first bottom electrode plate 28 and first storage nodes 30 are made of conductive material such as W, Ti, TiN, Ta, TaN, Al, or combination thereof. In addition to both the first bottom electrode plate 28 and first storage nodes 30 are composed of conductive material, the first bottom electrode plate 28 and first storage nodes 30 are preferably made of different material. For instance, the first bottom electrode plate 28 is preferably made of W and the first storage nodes 30 are made of TiN, but not limited thereto.

The first stack capacitor 18 further includes first supporting layers 32, 34 extending along a horizontal direction to connect the first storage nodes 30. It should be noted that even though two first supporting layers 32, 34 connecting multiple first storage nodes 30 are disclosed in this embodiment, the quantity of the first supporting layers 32, 34 could also be adjusted according to the demand of the product. Moreover, even though the first supporting layers 32, 34 are preferably made of dielectric material such as silicon nitride (SiN), it would also be desirable to use conductive materials for constituting the first supporting layers 32, 34. For instance, the first supporting layers 32, 34 could also be made of same conductive materials as the first storage nodes 30 or first bottom electrode plate 28 thereby constituting the first bottom electrode 22 together with the first storage nodes 30 and the first bottom electrode 28, which is also within the scope of the present invention.

The first capacitor dielectric layer 24 is preferably disposed on the first bottom electrode plate 28 and surrounds all of the first storage nodes 30 and first supporting layers 32, 34 so that the first bottom electrode plate 28, first storage nodes 30, and first supporting layers 32, 34 are insulated from the first top electrode 26. In this embodiment, the first capacitor dielectric layer 24 preferably includes a high-k dielectric layer and the high-k dielectric layer is preferably selected from dielectric materials having dielectric constant (k value) larger than 4. For instance, the high-k dielectric layer may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

According to a preferred embodiment of the present invention, the first top electrode 26 could be a multi-layered structured. For instance, the first top electrode 26 could further includes a first conductive layer 36 disposed on the first capacitor dielectric layer 24, a first polysilicon layer 38 on the first conductive layer 36, and a first top electrode plate 40 on the first polysilicon layer 38. In this embodiment, both the first conductive layer 36 and the first top electrode plate 40 could be made of W, Ti, TiN, Ta, TaN, Al, or combination thereof while the first conductive layer 36 and first top electrode plate 40 are made of different material. For instance, the first conductive layer 36 is preferably made of TiN while the first top electrode plate 40 is made of W, but not limited thereto. It should be noted that instead of forming a multi-layered first top electrode 26 as disclosed in this embodiment, the first top electrode 26 could also be a single layered structure made of a single conductive material layer, which is also within the scope of the present invention.

The second stacked capacitor 20 preferably includes two or more second bottom electrodes 44 on the substrate 12, a second capacitor dielectric layer 46 on the second bottom electrodes 44, and a second top electrode 48 on the second capacitor dielectric layer 46. In other words, in contrast to having one single top electrode corresponding to a single bottom electrode as disclosed in the first stacked capacitor 18, the second stacked capacitor 20 includes a design of having a single top electrode corresponding to multiple bottom electrodes while the bottom electrodes are not electrically connected to each other.

Viewing from a more detailed perspective, each of the second bottom electrodes 44 further includes a second bottom electrode plate 50 and a plurality of second storage nodes 52 disposed on the second bottom electrode plate 50, in which the second storage nodes 52 are columnar shaped and vertically elongated from the second bottom electrode plate 50, the distance between the second storage nodes 52 could be equivalent or different depending on the demand of the product, and an included angle between the elongated direction of the second storage nodes 52 and the extending direction of the second bottom electrode plate 50 is preferably 90 degrees. It should also be noted that even though three second storage nodes 52 disposed on each of the second bottom electrode plates 50 are disclosed in this embodiment, the quantity of the second storage nodes 52 could also be adjusted according to the demand of the product.

In this embodiment, both the second bottom electrode plates 50 and second storage nodes 52 are made of conductive material such as W, Ti, TiN, Ta, TaN, Al, or combination thereof. In addition to both the second bottom electrode plates 50 and second storage nodes 52 are composed of conductive material, the second bottom electrode plates 50 and second storage nodes 52 are preferably made of different material. For instance, the second bottom electrode plates 50 are preferably made of W and the second storage nodes 52 are made of TiN, but not limited thereto.

Similar to the first stack capacitor 18, the second stack capacitor 20 further includes second supporting layers 54, 56 extending along a horizontal direction to connect the second storage nodes 52. It should be noted that even though two second supporting layers 54, 56 connecting multiple second storage nodes 52 are disclosed in this embodiment, the quantity of the second supporting layers 54, 56 could also be adjusted according to the demand of the product. Moreover, even though the second supporting layers 54, 56 are preferably made of dielectric material such as silicon nitride (SiN), it would also be desirable to use conductive materials for constituting the second supporting layers 54, 56. For instance, the second supporting layers 54, 56 could also be made of same conductive materials as the second storage nodes 52 or second bottom electrode plates 50.

Figure 2:
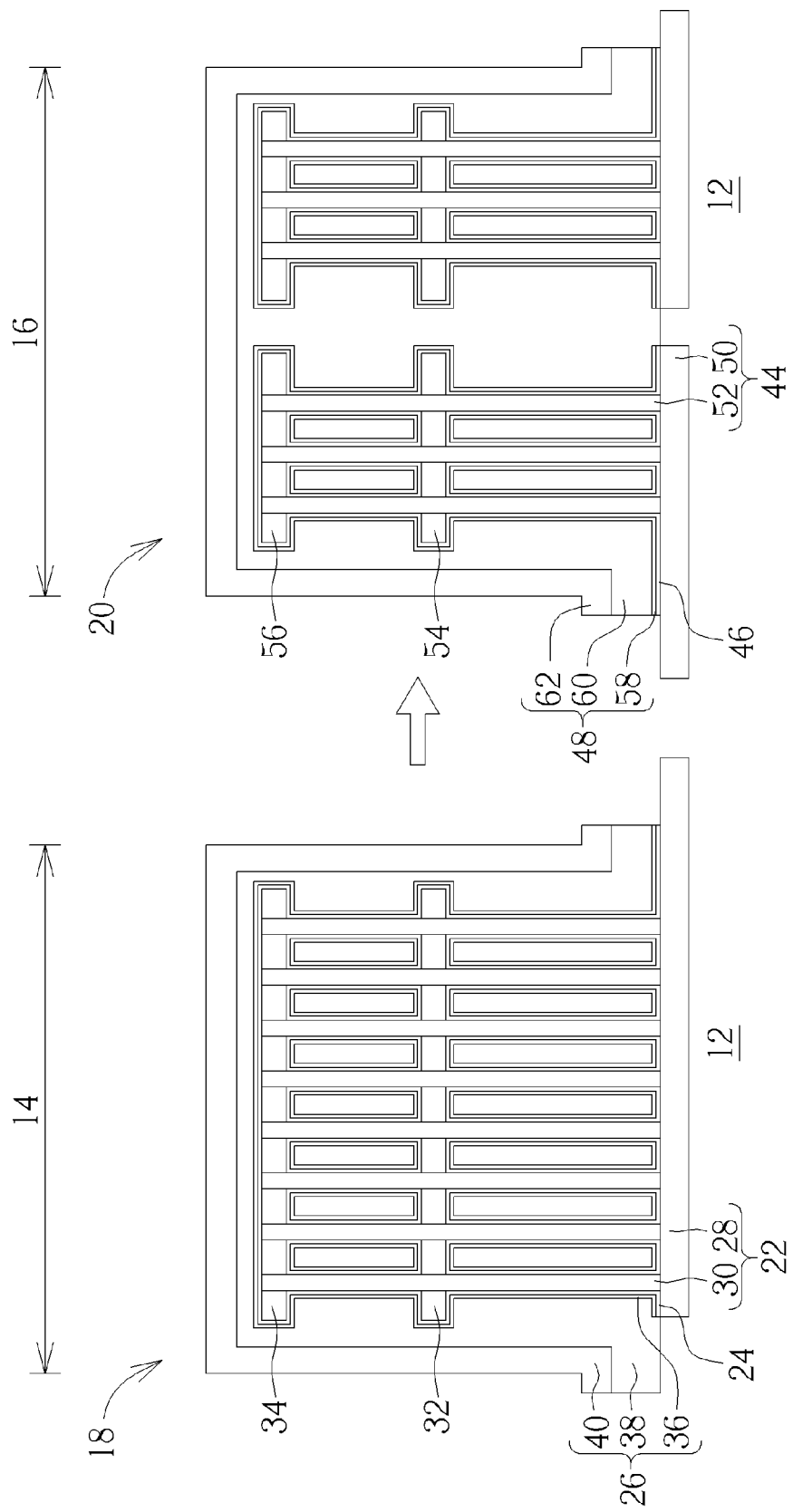
FIG. 2 illustrates a structural view of a semiconductor device according to an embodiment of the present invention.

According to an embodiment of the present invention, each of the second bottom electrodes 44 with corresponding second storage nodes 52 could be connected to a set of second supporting layers 54, 56 independently. For instance, as shown in FIG. 2, the second stacked capacitor 20 includes n number of second bottom electrodes 44 and n number of independent second supporting layers 54, 56, in which each of the independent second supporting layers 54, 56 and their corresponding second storage nodes 52 and second bottom electrode plate 50 forms a second bottom electrode 44, which is also within the scope of the present invention.

Figure 3:
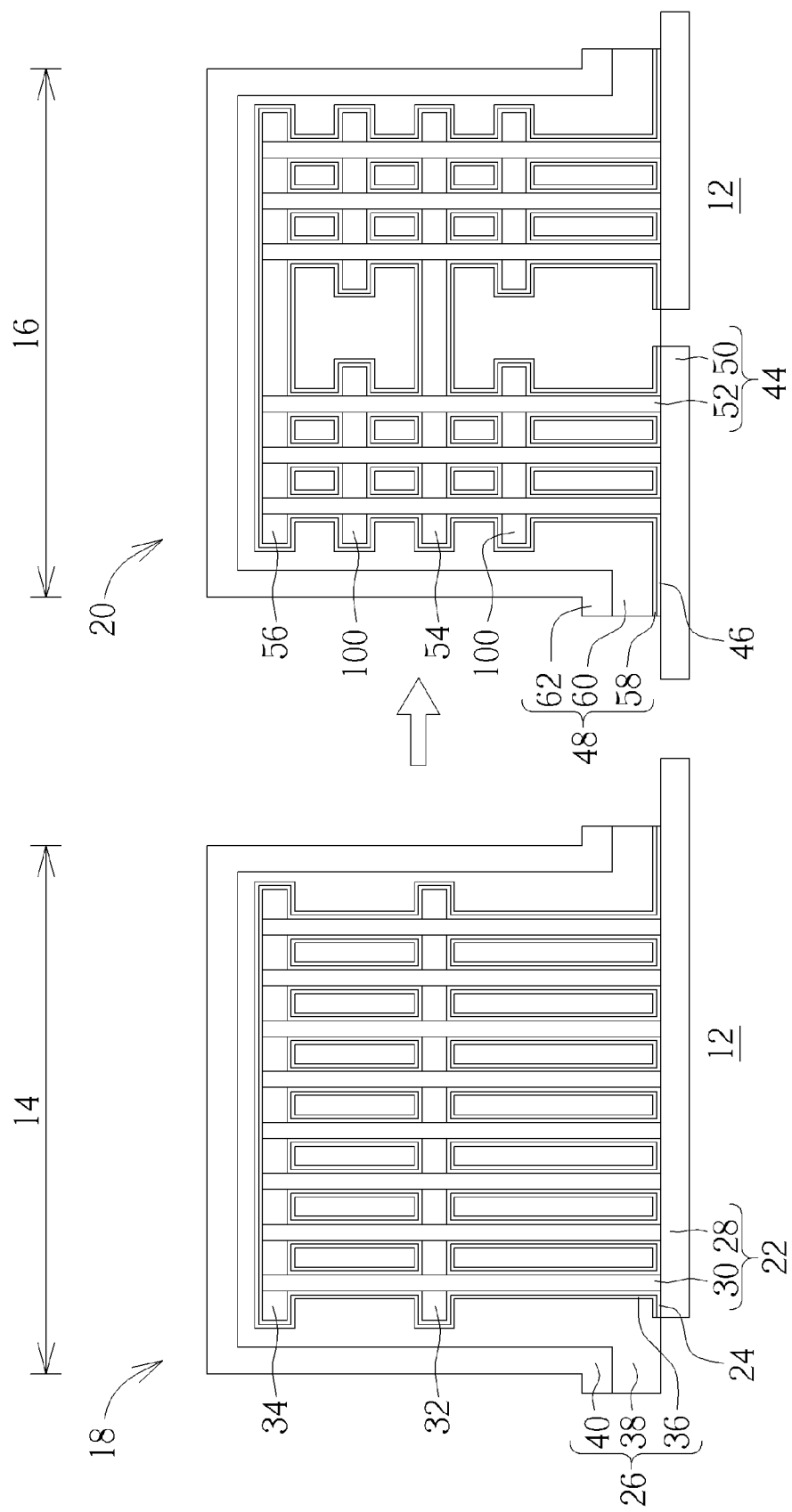
FIG. 3 illustrates a structural view of a semiconductor device according to an embodiment of the present invention.

According to yet another embodiment of the present invention, as shown in FIG. 3, by expanding the idea of having a single top electrode corresponding to multiple bottom electrodes as disclosed in the second stacked capacitor, it would be desirable to add additional second bottom electrode plates 100 between the second supporting layers 54, 56 and second bottom electrode plates 50 for increasing overall capacitance with the corresponding second storage nodes 52 and second bottom electrode plates 50.

The second capacitor dielectric layer 46 is preferably disposed on the second bottom electrode plates 50 to surround all of the second storage nodes 52 and second supporting layers 54, 56 so that the second bottom electrode plates 50, second storage nodes 52, and second supporting layers 54, 56 are insulated from the second top electrode 48. In this embodiment, the second capacitor dielectric layer 46 preferably includes a high-k dielectric layer and the high-k dielectric layer is preferably selected from dielectric materials having dielectric constant (k value) larger than 4. For instance, the high-k dielectric layer may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

According to a preferred embodiment of the present invention, the second top electrode 48 could be a multi-layered structured. For instance, the second top electrode 48 could further includes a second conductive layer 58 disposed on the second capacitor dielectric layer 46, a second polysilicon layer 60 on the second conductive layer 58, and a second top electrode plate 62 on the second polysilicon layer 60. In this embodiment, both the second conductive layer 58 and the second top electrode plate 62 could be made of W, Ti, TiN, Ta, TaN, Al, or combination thereof while the second conductive layer 58 and second top electrode plate 62 are made of different material. For instance, the second conductive layer 58 is preferably made of TiN and the second top electrode plate 62 is made of W, but not limited thereto. According to an embodiment of the present invention, instead of forming a multi-layered second top electrode 48, the second top electrode 48 could also be a single layered structure made of a single conductive material layer, which is also within the scope of the present invention.

Overall, each of the first stacked capacitor 18 on the memory region 14 and the second stacked capacitor 20 on the electric fuse region 16 includes bottom electrode, storage nodes, capacitor dielectric layer, and top electrode. Preferably, the first stacked capacitor 18 and the second stacked capacitor 20 could be fabricated by the same process, each of the elements from the first stacked capacitor 18 and second stacked capacitor 20 could also be made of same material.

It should be noted that in contrast to the first stacked capacitor 18 on the memory region 14 having a single bottom electrode plate corresponding to a single top electrode, the present preferably divides the single bottom electrode plate on the electric fuse region 16 into two or more bottom electrode plates. This provides a design of having two or more bottom electrode plates corresponding to a single top electrode in the electric fuse region 16. However, it should be noted that even though only two bottom electrode plates are disclosed in the aforementioned embodiments, the quantity or number of the bottom electrode plates formed could all be adjusted according to the demand of the product such as by forming more than bottom electrode plates, which is also within the scope of the present invention.

Preferably, each of the bottom electrode plates on the electric fuse region 16 and its connected capacitor elements including storage nodes, capacitor dielectric layer, and top electrode altogether constitute an electric fuse. By increasing the number of bottom electrode plates to two or more, the present invention is able to increase the number of usable electric fuse significantly under a same capacitor area.

Figure 4:
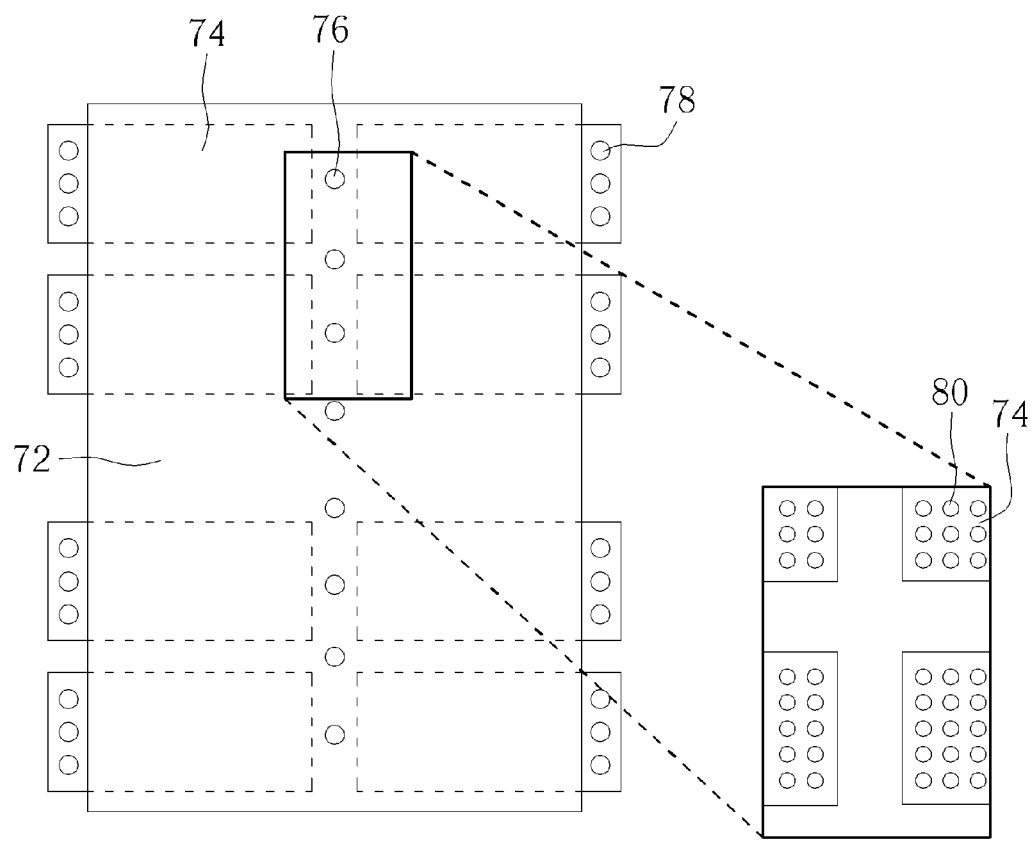
FIG. 4 illustrates a top view of an electric fuse structure having eight bottom electrode plates according to an embodiment of the present invention.

Referring to FIG. 4, FIG. 4 illustrates a top view of an electric fuse structure having eight bottom electrode plates according to an embodiment of the present invention. As shown in FIG. 4, the bottom electrode portion on the electric fuse region of this embodiment is preferably divided into eight bottom electrode plates in the manner similar to the embodiment illustrated in FIG. 1. Preferably, the electric fuse structure on the electric fuse region includes a top electrode 72, eight bottom electrode plates 74 corresponding to the single top electrode 72, and a plurality of contact plugs 76, 78 connected to the top electrode 72 and bottom electrode plates 74. In this embodiment, the eight bottom electrode plates 74 are arranged by placing four plates 74 into a group, in which multiple storage nodes 80 are disposed on each of the bottom electrode plates 74.

Figure 5:
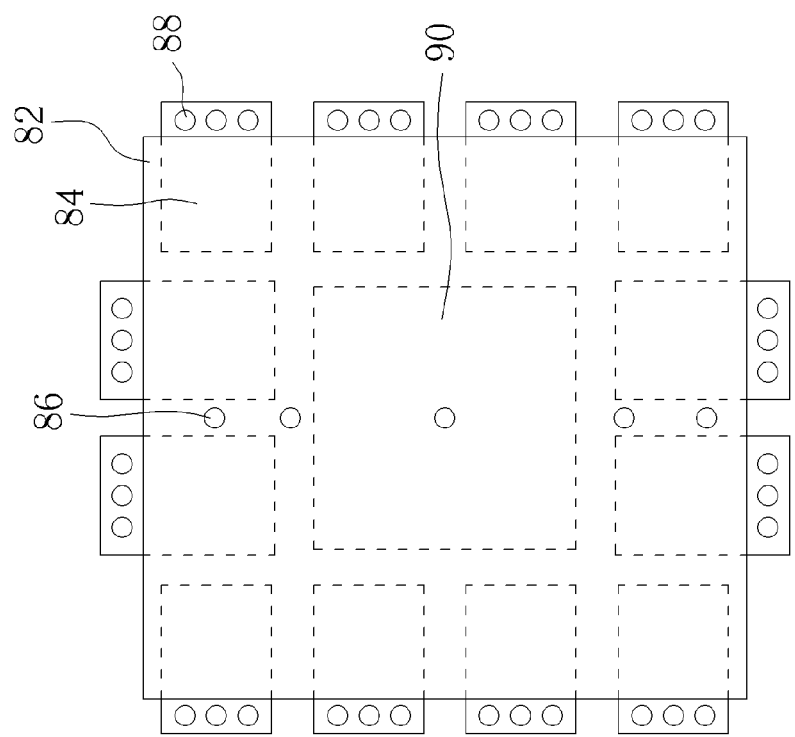
FIG. 5 illustrates a top view of an electric fuse structure having twelve bottom electrode plates according to an embodiment of the present invention.

Referring to FIG. 5, FIG. 5 illustrates a top view of an electric fuse structure having twelve bottom electrode plates according to an embodiment of the present invention. As shown in FIG. 5, the bottom electrode portion on the electric fuse region of this embodiment is preferably divided into twelve bottom electrode plates in the manner similar to the embodiment shown in FIG. 1. Preferably, the electric fuse structure on the electric fuse region includes a top electrode 82, twelve bottom electrode plates 84 corresponding to the single top electrode 82, and a plurality of contact plugs 86, 88 connected to the top electrode 82 and bottom electrode plates 84. In this embodiment, a dummy bottom electrode plate 90 is disposed on the center of the electric fuse structure while twelve bottom electrode plates 84 are disposed around the dummy bottom electrode plate 90.

Figure 6:
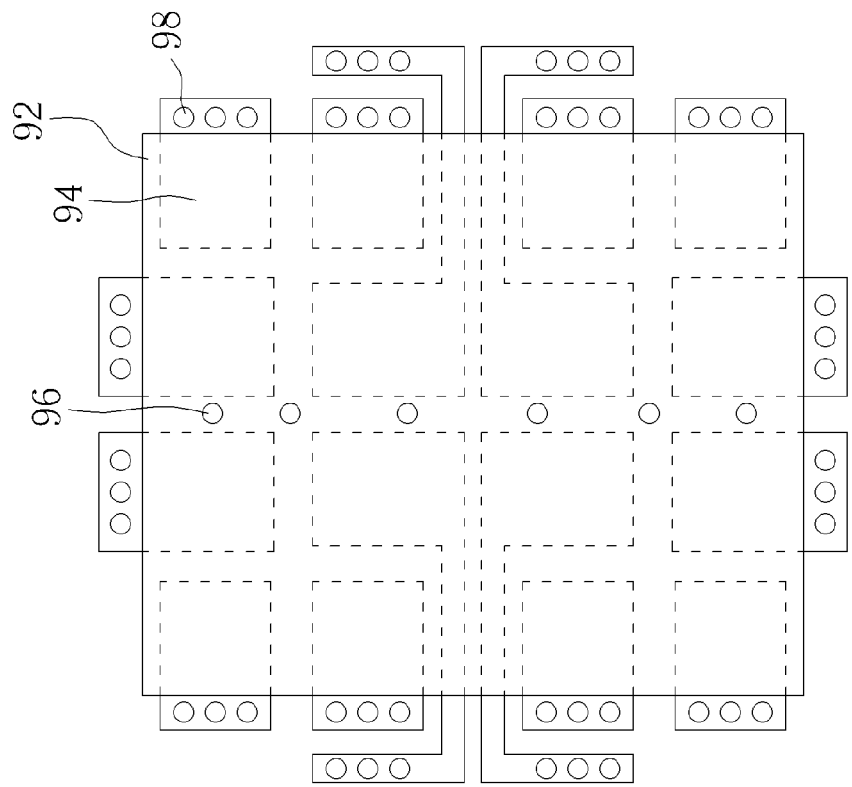
FIG. 6 illustrates a top view of an electric fuse structure having sixteen bottom electrode plates according to an embodiment of the present invention.

Referring to FIG. 6, FIG. 6 illustrates a top view of an electric fuse structure having sixteen bottom electrode plates according to an embodiment of the present invention. As shown in FIG. 6, the bottom electrode portion on the electric fuse region of this embodiment is preferably divided into sixteen bottom electrode plates in the manner similar to the embodiment shown in FIG. 1. Preferably, the electric fuse structure on the electric fuse region includes a top electrode 92, sixteen bottom electrode plates 94 corresponding to the single top electrode 92, and a plurality of contact plugs 96, 98 connected to the top electrode 92 and bottom electrode plates 94. In this embodiment, the sixteen bottom electrode plates 94 are arranged according to a matrix, in which four of the bottom electrode plates 94 placed on the center of the electric fuse structure are further extended outside of the adjacent bottom electrode plates 94.

Overall, the present invention preferably forms a stacked capacitor on a redundancy region or electric fuse region within a memory or DRAM device and uses the stacked capacitor as an electric fuse. In contrast to the conventional electric fuse structure implemented by stacked capacitors, the present invention preferably divides the bottom electrode plate of the capacitor into two or more while keeping a single top electrode so that each of the separated bottom electrode and its corresponding capacitor dielectric layer and top electrode could be serving as an independent electric fuse. By doing so, the number of usable electric fuse could be increased significantly while same capacitor area is maintained.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An electric fuse structure, comprising:
a substrate;
a stacked capacitor on the substrate, wherein the stacked capacitor comprises:
two or more bottom electrodes on the substrate;
a capacitor dielectric layer on the two or more bottom electrodes; and
a top electrode covers the capacitor dielectric layer and the two or more bottom electrodes, wherein the top electrode comprises:
a conductive layer on the capacitor dielectric layer;
a polysilicon layer on the conductive layer; and
a top electrode plate on the polysilicon layer.

2. The electric fuse structure of claim 1, wherein each of the two or more bottom electrodes comprises:
a bottom electrode plate; and
storage nodes on the bottom electrode plate.

3. The electric fuse structure of claim 2, wherein the bottom electrode plate and the storage nodes comprise different material.

4. The electric fuse structure of claim 2, wherein the storage nodes are vertically elongated from the bottom electrode plate.

5. The electric fuse structure of claim 2, further comprising a supporting layer connecting the storage nodes horizontally.

6. The electric fuse structure of claim 5, wherein the supporting layer comprises a dielectric material.

7. The electric fuse structure of claim 5, wherein the supporting layer comprise a conductive material.

8. The electric fuse structure of claim 5, wherein the capacitor dielectric layer surrounds the storage nodes and the supporting layer.

9. The electric fuse structure of claim 8, wherein the capacitor dielectric layer comprises a high-k dielectric layer.

10. A semiconductor device, comprising:
a substrate having a dynamic random access memory (DRAM) region and an electric fuse region defined thereon;
a first stacked capacitor on the DRAM region, wherein the first stacked capacitor comprises:
a first bottom electrode;
a first capacitor dielectric layer on the first bottom electrode; and
a first top electrode on the first capacitor dielectric layer;
a second stacked capacitor on the electric fuse region, wherein the second stacked capacitor comprises:
two or more second bottom electrodes;
a second capacitor dielectric layer on the two or more second bottom electrodes; and
a second top electrode covers the second capacitor dielectric layer and the two or more second bottom electrodes, wherein the second top electrode comprises:
a second conductive layer on the second capacitor dielectric layer;
a second polysilicon layer on the second conductive layer; and
a second top electrode plate on the second polysilicon layer.

11. The semiconductor device of claim 10, wherein the first bottom electrode comprises:
a first bottom electrode plate; and
first storage nodes on the first bottom electrode.

12. The semiconductor device of claim 11, further comprising a first supporting layer connecting the first storage nodes horizontally.

13. The semiconductor device of claim 12, wherein the first capacitor dielectric layer surrounds the first storage nodes and the first supporting layer.

14. The semiconductor device of claim 10, wherein the first top electrode comprises:
a first conductive layer on the first capacitor dielectric layer;
a first polysilicon layer on the first conductive layer; and
a first top electrode plate on the first polysilicon layer.

15. The semiconductor device of claim 10, wherein each of the two or more second bottom electrodes comprises:
a second bottom electrode plate; and
second storage nodes on the second bottom electrode plate.

16. The semiconductor device of claim 15, further comprising a second supporting layer connecting the second storage nodes horizontally.

17. The semiconductor device of claim 16, wherein the second supporting layer comprises a dielectric material.

18. The semiconductor device of claim 16, wherein the second capacitor dielectric layer surrounds the second storage nodes and the second supporting layer.

* * * * *